USO11431291B1

United States Patent
Lee et al.

(10) Patent No.: US 11,431,291 B1
(45) Date of Patent: Aug. 30, 2022

(54) FREQUENCY-TUNABLE NANO-OSCILLATOR DEVICE AND COMPUTING UNIT USING THE SAME

(71) Applicant: KOREA INSTITUTE OF SCIENCE AND TECHNOLOGY, Seoul (KR)

(72) Inventors: Suyoun Lee, Seoul (KR); Seon Jeong Kim, Seoul (KR); Jong-Keuk Park, Seoul (KR); Inho Kim, Seoul (KR); Kyeong Seok Lee, Seoul (KR); Gyu Weon Hwang, Seoul (KR); Joon Young Kwak, Seoul (KR); Jaewook Kim, Seoul (KR); Yeonjoo Jeong, Seoul (KR); Jongkil Park, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 0 days.

(21) Appl. No.: 17/467,457

(22) Filed: Sep. 7, 2021

(30) Foreign Application Priority Data

Jun. 30, 2021 (KR) .......................... 10-2021-0085663

(51) Int. Cl.
  *H03B 5/24* (2006.01)
  *H01L 45/00* (2006.01)
  *H03K 17/96* (2006.01)
(52) U.S. Cl.
  CPC .............. *H03B 5/24* (2013.01); *H01L 45/122* (2013.01); *H01L 45/141* (2013.01); *H01L 45/1608* (2013.01); *H03K 17/9622* (2013.01)
(58) Field of Classification Search
  CPC ......... G11C 11/00; H03B 5/24; H01L 45/141; H01L 45/1608; H01L 45/122; H03K 17/9622

(Continued)

(56) References Cited

U.S. PATENT DOCUMENTS 7,466,584 B1 * 12/2008 Parkinson ................ G11C 8/10
  365/148
8,063,709 B2  11/2011 Firastrau et al.
  (Continued)

FOREIGN PATENT DOCUMENTS

CN       110750235 A   2/2020
KR  10-2014-0095348 A   8/2014
  (Continued)

OTHER PUBLICATIONS

"A highly scalable and energy-efficient artificial neuron using an Ovonic Threshold Switch (OTS) featuring the spike-frequency adaptation and chaotic activity" by Lee et al. (NPL Physics Rev. Applied 13, 064056 Publ Jun. 23, 2020) [Submitted on Oct. 19, 2018] (Year: 2020).*

(Continued)

*Primary Examiner* — Arnold M Kinkead
(74) *Attorney, Agent, or Firm* — Cantor Colburn LLP

(57) ABSTRACT

A nano-oscillator device includes a switching element configured to be switched to an ON state at a threshold voltage or above and switched to an OFF state below a holding voltage; and a load element connected to the switching element in series. In the nano-oscillator device, vibration characteristics are implemented by using a switching element and a load element connected thereto in series. Also, the oscillation frequency of the output waveform of the oscillator may be adjusted in real time according to a gate voltage by using a field effect transistor serving as a load element. Using a synchronization characteristic in which the oscillation frequency and phase are locked with respect to an external input, it is possible to implement a computing system based on a network in which a plurality of oscillator devices are coupled.

8 Claims, 19 Drawing Sheets

(58) Field of Classification Search
USPC ....... 365/148, 163, 113; 331/107 DP, 107 A,
331/108 D, 172, 111, 143; 257/4;
438/382
See application file for complete search history.

(56) References Cited

U.S. PATENT DOCUMENTS

2004/0184331 A1* 9/2004 Hanzawa ............... G11C 11/16
365/203
2020/0349453 A1 11/2020 Ronagh

FOREIGN PATENT DOCUMENTS

KR  10-2020-0059113 A   5/2020
WO     2015/195122 A1  12/2015

OTHER PUBLICATIONS

Nikhil Shukla et al., "Synchronized charge oscillations in correlated electron systems," Scientific Reports, 2014, 6 pages, vol. 4, No. 4964.

* cited by examiner

FREQUENCY-TUNABLE NANO-OSCILLATOR DEVICE AND COMPUTING UNIT USING THE SAME

CROSS-REFERENCE TO RELATED APPLICATION

This application claims priority to Korean Patent Application No. 10-2021-0085663, filed on Jun. 30, 2021, and all the benefits accruing therefrom under 35 U.S.C. § 119, the contents of which in its entirety are herein incorporated by reference.

BACKGROUND

1. Field

The present disclosure relates to an oscillator device for realizing an output waveform oscillating at a certain period, and more particularly, to a nano-oscillator device that may be manufactured in a miniature size without a capacitor by using a threshold switching element and a load element connected thereto in series.

2. Description of the Related Art

An electronic oscillator is a device for realizing voltage and current of a vibration waveform that is repeated at a certain period, and is used in various electronic products ranging from communication devices to computer devices. Recently, an oscillator has been actively studied as a component for a new type of computing system, such as an Ising machine. Such a non-traditional computing system is in the spotlight because it can easily solve problems that cannot be easily solved by a conventional computing system such as a Turing machine, and has high energy efficiency.

The conventional oscillator device is composed of a digital inverter circuit or an inductor-capacitor (LC) combination circuit, which inevitably requires a large area due to the large size of the components (especially, the capacitor), and therefore, it is difficulty to utilize the conventional oscillator device for large-scale computing that requires a large number of oscillator devices.

In order to solve the structural problem of the conventional oscillator device, an oscillator device that may be manufactured in a small size such as spin-torque nano-oscillators (STNOs), spin-hole nano-oscillators (SHNOs), and relaxation oscillators (ROs) has been studied. However, the spin-torque/spin-nano-oscillator not only requires a magnetic tunnel junction with a complex structure, but also requires an external magnetic field to realize the vibration characteristics, which results in large energy consumption. The relaxation oscillator is different in that it uses a switching element, but it includes a capacitor that occupies a relatively large area as a component, so there is a problem in that the scalability is inferior like the conventional L-C circuit-based oscillator.

SUMMARY

Accordingly, the present disclosure is directed to providing a nano-oscillator device of a novel structure that may be implemented using a switching element and a load element. In addition, the present disclosure is directed to providing an oscillator device capable of arbitrarily adjusting the oscillation frequency of an output waveform according to a gate voltage by using a field effect transistor serving as a load element.

In one aspect, there is provided a nano-oscillator device, comprising: a switching element configured to be switched to an ON state at a threshold voltage or above and switched to an OFF state below a holding voltage; and a load element connected to the switching element in series, wherein an output waveform at a node between the switching element and the load element has a vibration characteristic that is repeated at a predetermined period.

According to an embodiment, the switching element may be an OTS (Ovonic Threshold Switch) made of an amorphous chalcogenide substance.

According to an embodiment, the load element may be a transistor element, and an oscillation frequency of the output waveform may be adjusted in real time according to a gate voltage applied to the transistor element.

According to an embodiment, an oscillation frequency of the output waveform may be adjusted within the range of 0.5-2 MHz.

According to an embodiment, the load element may be a resistor element.

According to an embodiment, an oscillation frequency of the output waveform may be determined according to a resistance value of the resistor element.

A nano-oscillator device according to an embodiment exhibits a synchronization characteristic in which the oscillation frequency of the output waveform with respect to an AC input coincides with the oscillation frequency of the AC input.

In another aspect, there is also provided an oscillator-based computing unit, which is implemented using a network in which the nano-oscillator devices according to an embodiment are coupled.

According to an embodiment, each of the nano-oscillator devices may be connected to a nano-oscillator device adjacent thereto by a field effect transistor.

According to an embodiment, a phase difference between the oscillator devices may be controlled according to the change of a gate voltage applied to a gate terminal of the field effect transistor.

According to an embodiment, each of the nano-oscillator devices may be connected to a nano-oscillator device adjacent thereto by a capacitor or a resistor.

According to an embodiment, a phase difference between the oscillator devices may be controlled by setting a capacitance of the capacitor or a resistance value of the resistor.

The nano-oscillator device according to an embodiment of the present disclosure implements vibration characteristics by using a switching element and a load element connected thereto in series, so the nano-oscillator device can be manufactured in a much smaller size compared to a conventional oscillator device including a capacitor.

According to another embodiment of the present disclosure, the oscillation frequency of the output waveform of the oscillator may be adjusted in real time according to a gate voltage by using a field effect transistor.

The nano-oscillator device having the structure according to the embodiment exhibits a synchronization characteristic in which the oscillation frequency of the output waveform with respect to an AC input coincides with an oscillation frequency of the AC input. Therefore, it is possible to implement an oscillator-based computing system by using a network in which a plurality of oscillator devices are coupled.

BRIEF DESCRIPTION OF THE DRAWINGS

In order to more clearly explain the technical solution of the present disclosure or the embodiments of the prior art, the drawings necessary to describe the embodiments are briefly introduced below. It should be understood that the following drawings are for the purpose of explaining the embodiments of the present specification and not for the purpose of limitation. In addition, for clarity of description, some components in the drawings may be exaggerated or omitted.

DETAILED DESCRIPTION

Figure 1:
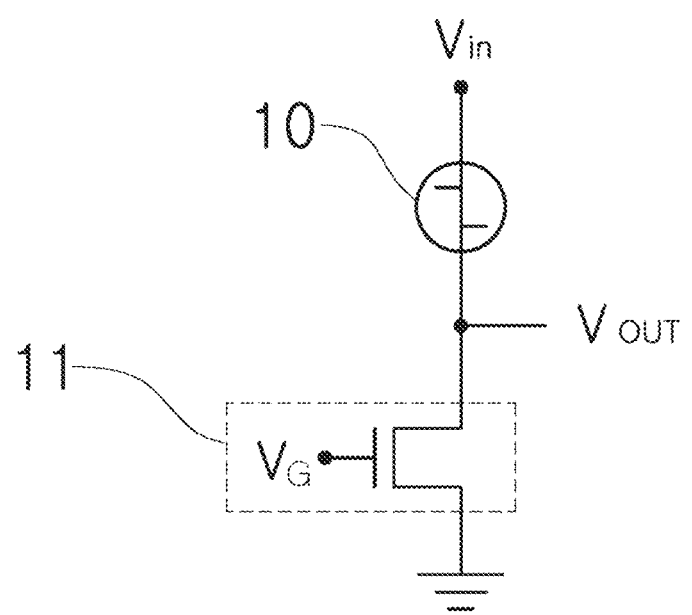
FIG. 1 shows a circuit diagram showing a nano-oscillator device capable of adjusting an oscillation frequency according to an embodiment.

The present disclosure will be described in detail later with reference to the accompanying drawings that illustrate specific embodiments in which the present disclosure may be practiced. These embodiments are described in sufficient detail to enable those skilled in the art to practice the present disclosure. It should be understood that various embodiments of the present disclosure are different but need not be mutually exclusive. For example, certain shapes, structures and characteristics described herein with respect to one embodiment may be implemented in other embodiments without departing from the idea and scope of the present disclosure. In addition, it should be understood that locations or arrangement of individual components in each disclosed embodiment may be changed without departing from the idea and scope of the present disclosure. Accordingly, the detailed description set forth below is not intended to be taken in a limiting sense, and the scope of the present disclosure, if properly set forth, is limited only by the appended claims, along with all scopes equivalent thereto. Like reference numerals in the drawings refer to the same or similar functions throughout various aspects.

The terms used in this specification have been selected as widely used general terms as possible in consideration of their functions, but may be changed depending on the intention or custom of a person skilled in the art or the advent of new technology. In addition, in a specific case, there is a term arbitrarily selected by the applicant, and in this case, its meaning will be described in the corresponding portion of the specification. Therefore, it should be understood that the terms used in this specification should be interpreted based on the actual meaning of the terms and the contents of the entire specification, rather than simply based on names of the terms.

Hereinafter, preferred embodiments of a nano-oscillator device will be described in detail with reference to the drawings.

Figure 2:
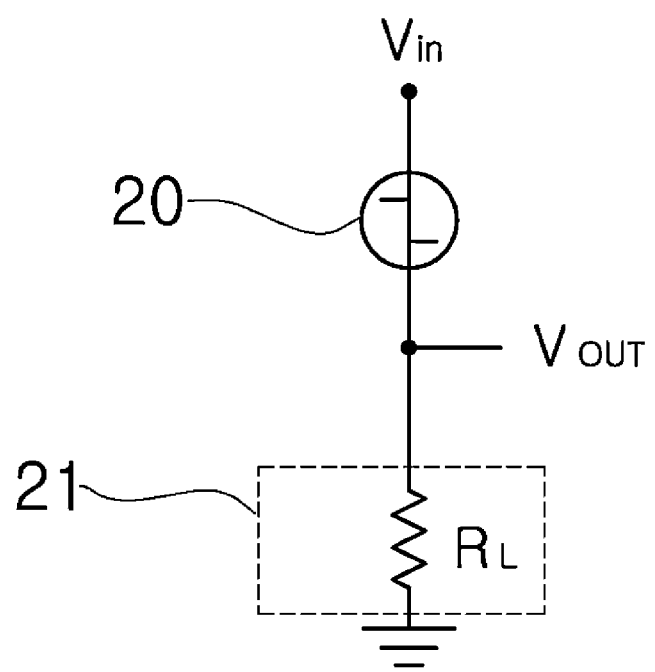
FIG. 2 shows a circuit diagram showing a nano-oscillator device having a passive element according to an embodiment.

A nano-oscillator device according to an embodiment of the present disclosure includes a switching element and a load element, and the load element and the switching element are connected in series (see the circuit diagram of FIG. 1 or 2).

The switching element is a threshold switch, which is switched to an ON state at a threshold voltage or above and switched to an OFF state below a holding voltage. The switching element may be, for example, an OTS (Ovonic Threshold Switch) using an amorphous chalcogenide substance. Unlike conventional vanadium oxide-based switches used in relaxation oscillators or the like, the OTS switch made of an amorphous chalcogenide substance has an advantage of maintaining oscillator characteristics despite a temperature change because the switching characteristics do not change according to a temperature change. However, the type of switch is not limited thereto, and various types of threshold switches may be employed.

If a voltage higher than the threshold voltage is applied to the switching element, the switching element is switched to an ON state to conduct a current, and the resistance value becomes very small (about 100Ω). At this time, most voltage is applied to the load element connected to the switching element in series, and the voltage applied to both ends of the switching element falls below the holding voltage, and the switching element is switched to an OFF state again. In the OFF state, the resistance value of the switch becomes very large (about 10-100 MΩ), so most of the voltage is applied to the switching element again. Also, if the voltage at both ends exceeds the threshold voltage, the switching element is switched to an ON state. By repetitive on/off switching of the switching element, the current/voltage at an output node is repeatedly increased and decreased, and the vibration characteristics of the oscillator are realized by the delay generated in this process.

A conventional oscillator (e.g., a relaxation oscillator) implements vibration characteristics through repeated charging and discharging of a capacitor. In contrast, in the structure of the present disclosure, the threshold switching element operates similarly to a capacitor (e.g., the OTS uses a charge trapping principle of an amorphous chalcogenide substance), so vibration characteristics may be realized without a capacitor. Therefore, the size and volume of the oscillator device may be significantly reduced, and a large-scale computing system that requires a large number of oscillator devices may be implemented.

The nano-oscillator device having the structure according to the embodiment may have additional characteristics according to the type of load element. For example, if a resistor that is a passive element is used, an oscillator having a fixed oscillation frequency determined according to the resistance value may be implemented, whereas if an active element such as a field effect transistor is used, the oscillation frequency of the oscillator may be adjusted in real time according to the gate voltage.

FIG. 1 shows a circuit diagram showing a nano-oscillator device capable of adjusting an oscillation frequency according to an embodiment. As shown in FIG. 1, the nano-oscillator device according to the embodiment includes a switching element 10 and a transistor element 20 connected to the switching element 10 in series. As the switching element 10, an OTS made of an amorphous chalcogenide substance may be used as described above. The transistor element 20 is, for example, a field effect transistor (FET), and operates as a variable resistor whose resistance value changes according to a gate voltage ($V_G$) applied through a gate terminal.

In order for a switch (OTS) and a transistor (FET) connected in series to operate as an oscillator, an output resistance ($R_{FET}$) of the transistor should be larger than an ON resistance ($R_{on}$; a resistance value when the switch is in an ON state) and smaller than an OFF resistance ($R_{off}$; a resistance value when the switch is in an OFF state). Under this assumption, if a bias voltage greater than a threshold voltage is applied, the switching element is repeatedly switched to an ON state and an OFF state as described above, so that the output waveform exhibits vibration characteristics. Since the time during which the OTS element maintains the ON state depends on a discharge time of the trap state in the amorphous chalcogenide substance, the oscillation frequency of the oscillator is determined by the resistance value of the transistor element. Since the resistance value ($R_{FET}$) of the field effect transistor may be controlled by the gate voltage ($V_G$) applied to the gate terminal, as a result, it is possible to arbitrarily adjust the oscillation frequency of the oscillator through the gate voltage.

FIG. 2 shows a circuit diagram showing a nano-oscillator device having a passive element according to an embodiment. Referring to FIG. 2, the oscillator device according to the embodiment includes a switching element 10 and a resistor element 21 connected to the switching element 10 in series. The switching element 10 is a threshold switch (e.g., an OTS made of an amorphous chalcogenide substance) that is switched to an ON state at a threshold voltage or above and switched to an OFF state below a holding voltage, similar to the embodiment of FIG. 1. Unlike the transistor element 20 that operates as a variable resistor in the embodiment of FIG. 1, the resistor element 21 has a fixed resistance value, so the oscillation frequency of the oscillator of FIG. 2 is determined according to the resistance value of the resistor element 21.

Figure 3:
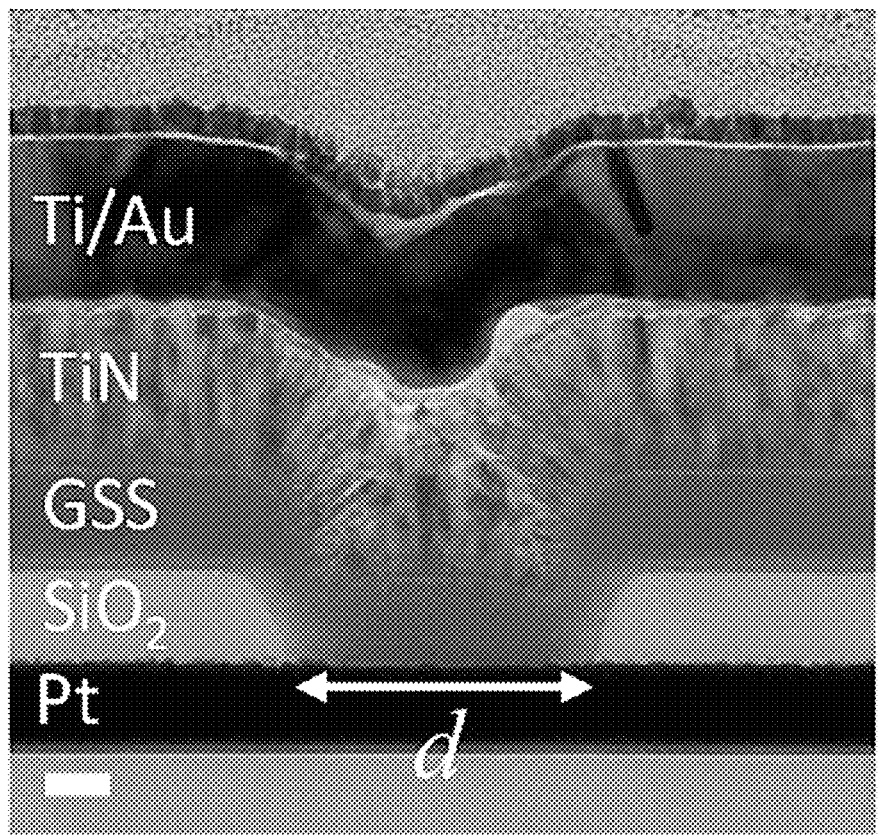
FIG. 3 is an electron micrograph showing a cross section of an OTS element according to an embodiment.

FIG. 3 is an electron micrograph showing a cross section of an OTS element according to an embodiment. Referring to FIG. 3, the OTS element is made of an amorphous chalcogenide substance located between an upper electrode (Ti/Au) and a lower electrode (Pt), and exhibits reversible switching characteristics. The width (d) of the OTS element may be set to about 300 nm, but is not limited thereto.

Figure 4:
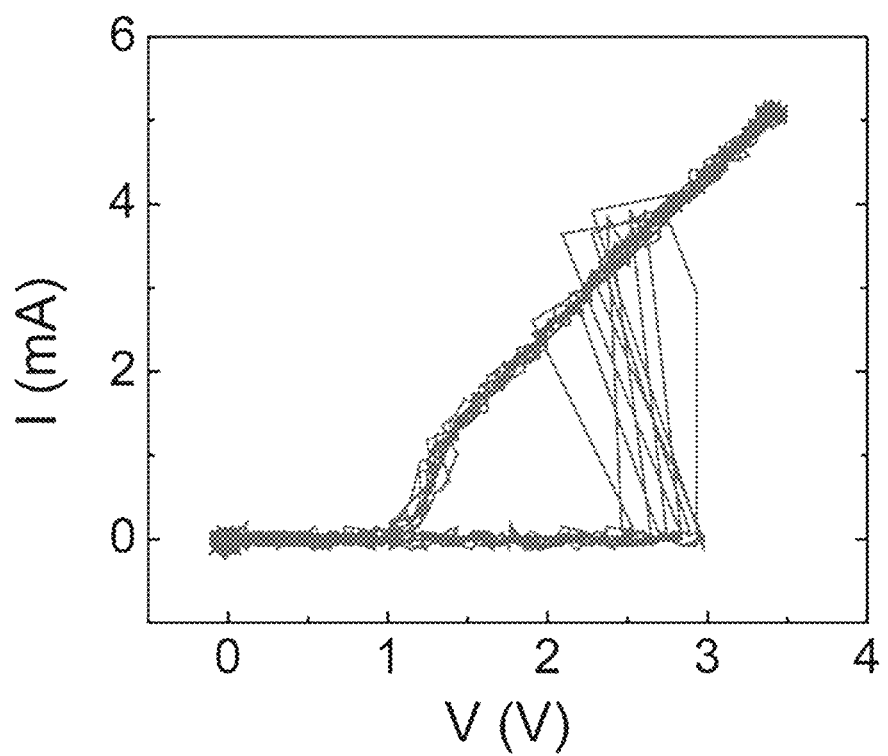
FIG. 4 is a graph showing I-V characteristics of the OTS element according to an embodiment.

FIG. 4 is a graph showing I-V characteristics of the OTS element according to an embodiment. The graph of FIG. 4 shows the results repeatedly measured 10 times, and the threshold voltage ($V_{th}$) of the switching element is about 2.5-3.0 V. Meanwhile, the holding voltage ($V_H$) is about 1 V.

Figure 5:
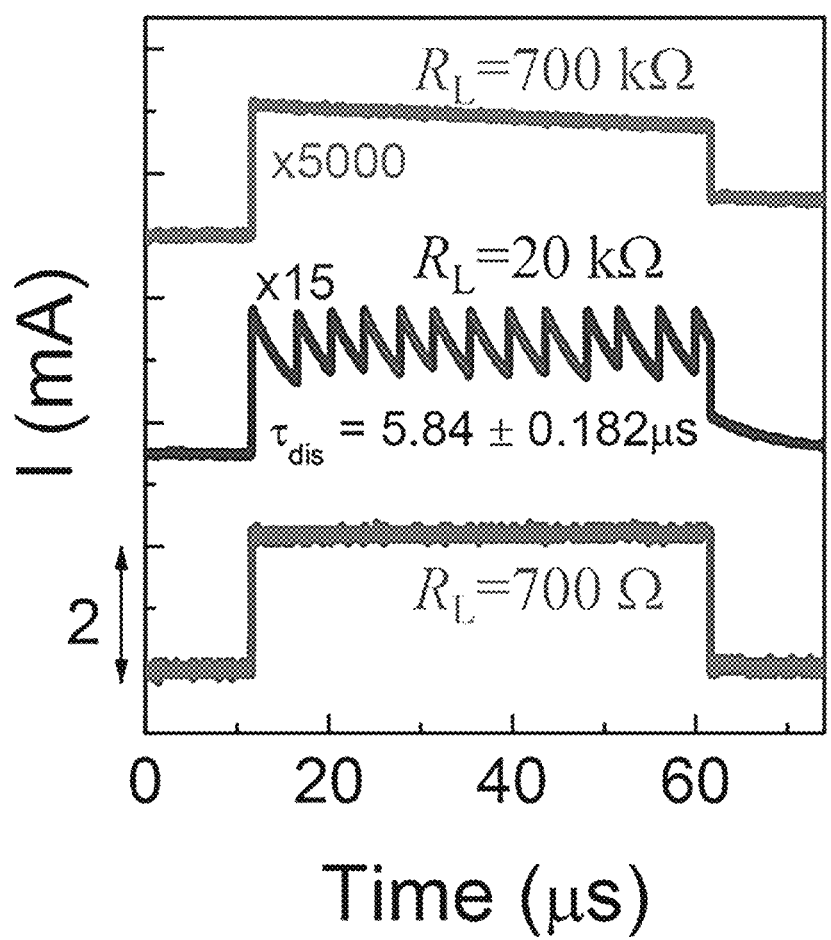
FIG. 5 is a graph showing the output waveform of a nano-oscillator device according to an embodiment for each magnitude of a resistance value.

FIG. 5 is a graph showing the output waveform of a nano-oscillator device according to an embodiment for each magnitude of a resistance value. In this embodiment, the nano-oscillator device has a structure in which the switching element and the resistor element are connected in series. A DC voltage bias of 4 V was applied to the device, and the output voltage according to time was measured while changing the resistance value of the resistor element. As can be seen from the graph of FIG. 5, the oscillator device exhibits vibration characteristics only with respect to a resistance value in a specific range. Specifically, when the load resistance ($R_L$) is too large (700 kΩ) and too small (0.7 kΩ), the output waveform does not show vibration characteristics, and it may be found that vibration characteristics appear when the load resistance ($R_L$) is 20 kΩ. The range of the resistance value of the load element showing the vibration characteristic may vary depending on various variables such as the characteristic of the switching element and the input voltage value.

Figure 6:
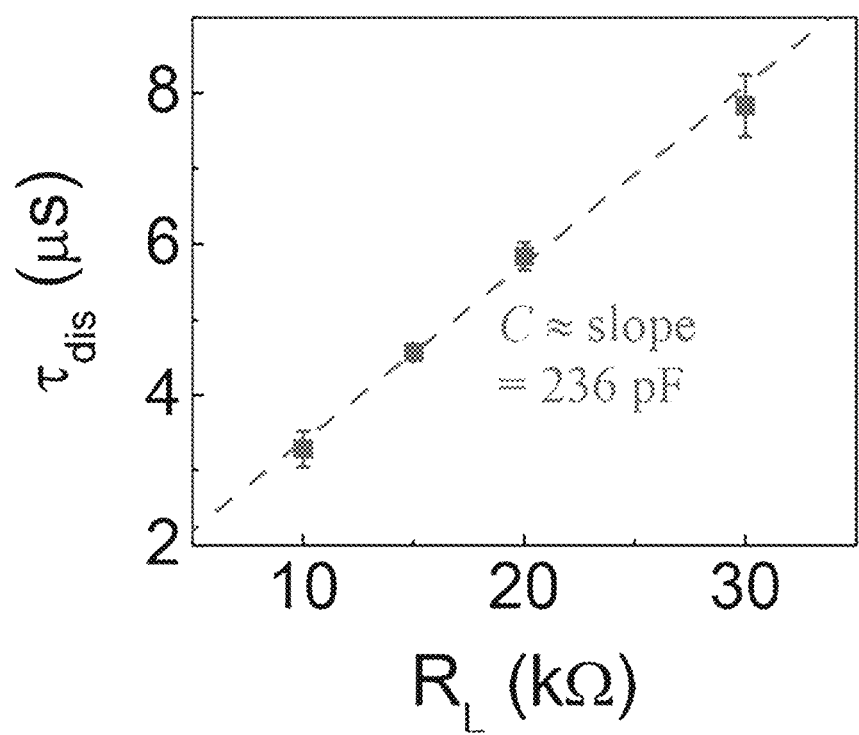
FIG. 6 is a graph for explaining vibration characteristics of the nano-oscillator device according to an embodiment.

FIG. 6 is a graph for explaining vibration characteristics of the nano-oscillator device according to an embodiment. If the OTS switching element used in the oscillator device is modeled as a parallel connection structure of the load resistance ($R_L$) and the parasitic capacitor ($C_{para}$), $T_{dis}$ representing the characteristic time for discharge is proportional to $R_L$ and $C_{para}$. FIG. 6 shows the measured results with an oscillator device according to the embodiment. In the graph, the slope of the dotted line is close to the $C_{para}$ value, and the capacitance is measured to be about 236 pF. Such a high capacitance can not be explained by the parasitic capacitance considering the dimensions and the dielectric constant of the components of the OTS device. Therefore, it may be found that the parasitic capacitor hardly plays a role in the oscillator structure with the OTS element and the resistance. If this structure is used, this means that an OTS-based oscillator device can be implemented without a capacitor.

Figure 7A:
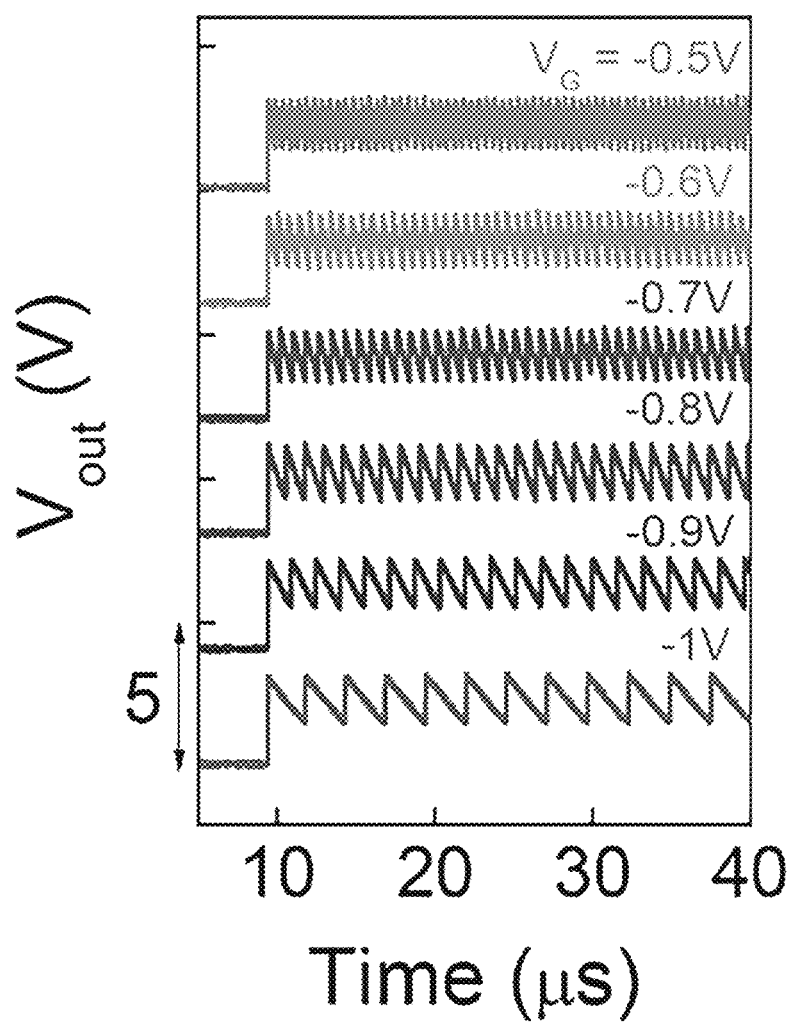
FIG. 7A is a graph showing the output waveform of the nano-oscillator device according to an embodiment according to the magnitude of a gate voltage applied to a field effect transistor.

FIG. 7A is a graph showing the output waveform of the nano-oscillator device according to an embodiment according to the magnitude of a gate voltage applied to a field effect transistor. In this embodiment, the nano-oscillator device is composed of one switching element (e.g. OTS) and one transistor element (e.g., FET). The graph of FIG. 7A shows the measurement result of the voltage output from the output terminal (the node between the OTS and the FET) after a DC voltage bias of 4 V is applied to the input terminal. As shown in the figure, as the gate voltage ($V_G$) applied to the transistor element increases from −1 V (see the bottom graph) to −0.5 V (see the top graph), the oscillation frequency of the output waveform (namely, the intrinsic oscillation frequency of the oscillator) increases.

Figure 7B:
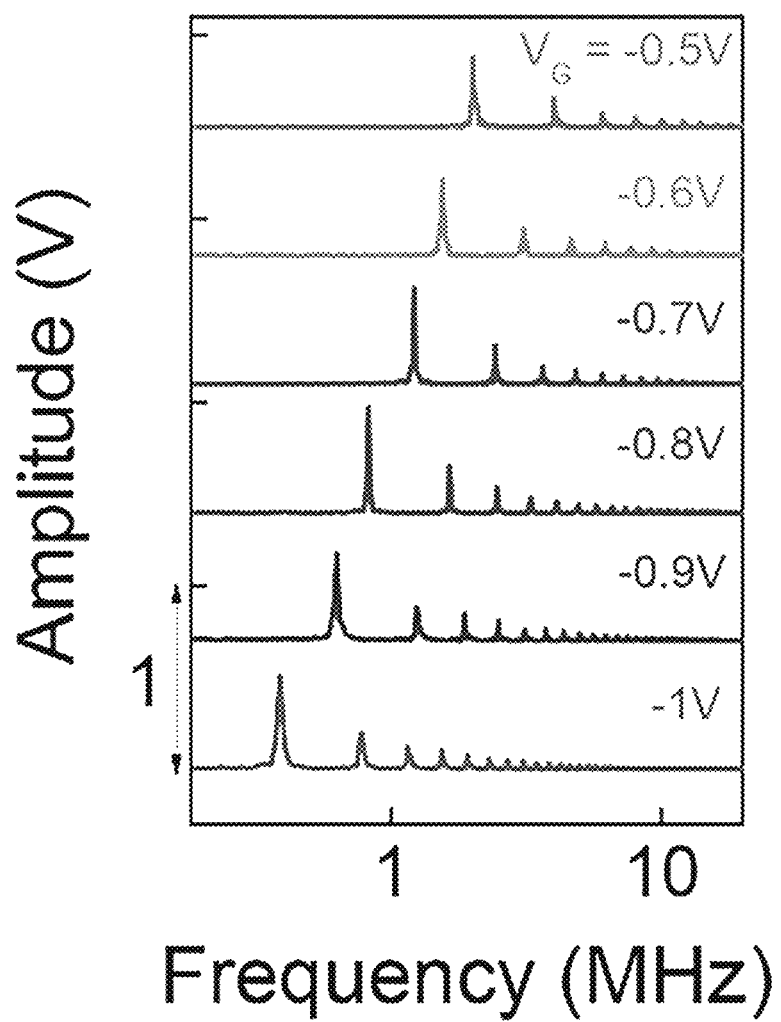
FIG. 7B is a graph showing the magnitude of an oscillation frequency component of the output waveform by performing FFT (Fast Fourier Transform) to the output waveform of FIG. 7A.

FIG. 7B is a graph showing the magnitude of an oscillation frequency component of the output waveform by performing FFT (Fast Fourier Transform) to the output waveform of FIG. 7A. Here, the intrinsic oscillation frequency of the oscillator is defined as a primary peak of each graph, and subsequent satellite peaks represent harmonics. As shown in FIG. 7B, the intrinsic oscillation frequency value may be adjusted in the range of about 0.5-2 MHz according to the control of the gate voltage.

Figure 7C:
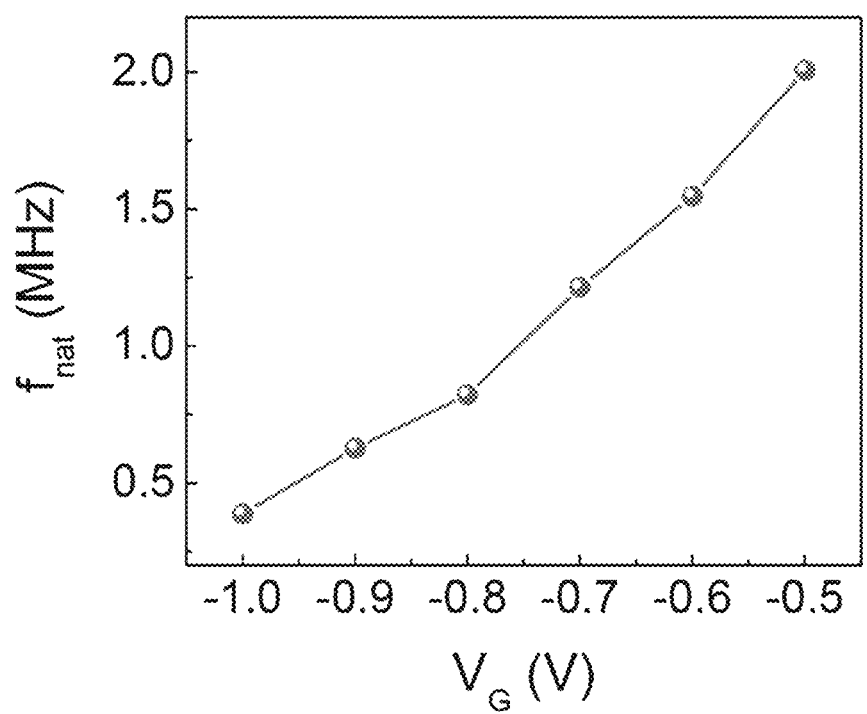
FIG. 7C is a graph showing the change of intrinsic oscillation frequency according to the magnitude of the gate voltage in the nano-oscillator device of FIG. 7A.

FIG. 7C is a graph showing the change of intrinsic oscillation frequency according to the magnitude of the gate voltage in the nano-oscillator device of FIG. 7A. As shown in the figure, it may be found that the intrinsic oscillation frequency ($f_{nat}$) increases in linear proportion to the gate voltage ($V_G$), and from these results, it may be found that the oscillation of the OTS-based oscillator is composed of the fundamental oscillation frequency component and harmonics that can ignore other components.

The nano-oscillator device according to the former embodiments exhibits a synchronization characteristic in which the oscillation frequency of the output waveform with respect to an AC input coincides with the oscillation frequency of the AC input. These characteristics indicate that the oscillation frequency and phase of the oscillator are locked against an external force having a small oscillation element in a single oscillator device.

Figure 8A:
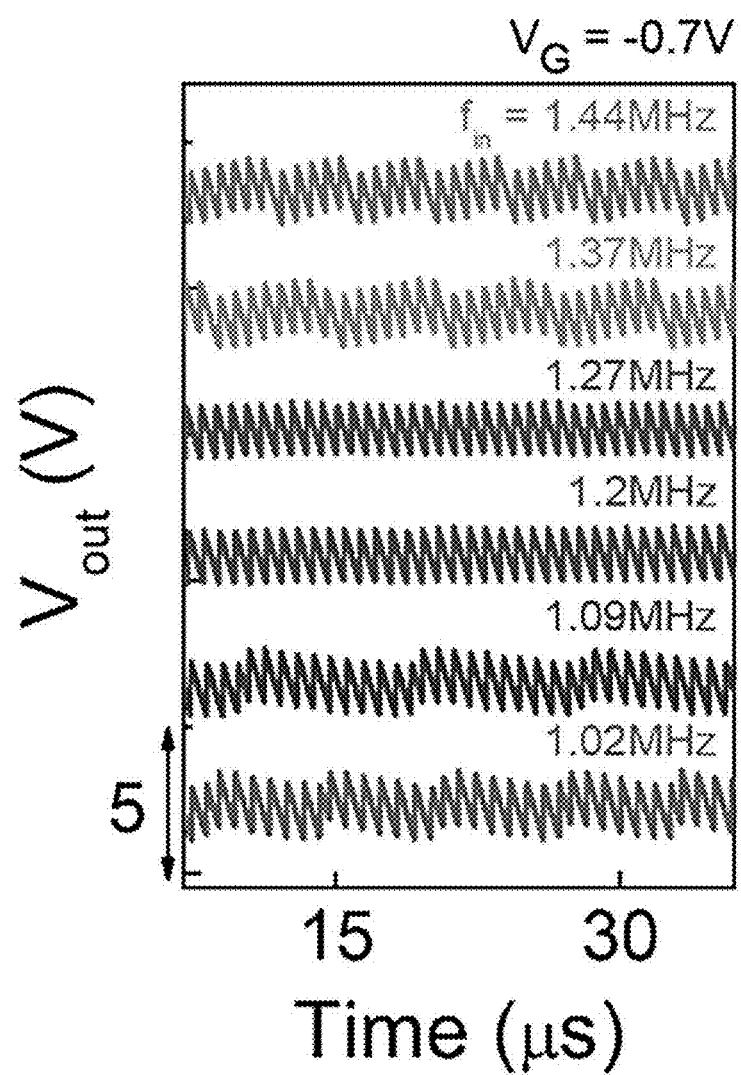
FIG. 8A is a graph showing the change of the output waveform according to an input oscillation frequency when an AC input is applied to the nano-oscillator device according to an embodiment.

FIG. 8A is a graph showing the change of the output waveform according to an input oscillation frequency when an AC input is applied to the nano-oscillator device according to an embodiment. In this embodiment, the output waveform of the OTS-based nano-oscillator device was measured in a state where an input bias having a DC component of 4 V and an AC component of 0.23-0.27 V and a gate voltage of −0.7 V were applied. As shown in the figure, if the input oscillation frequency is 1.27 MHz and 1.2 MHz (two waveforms in the middle of the graph), it may be found that the output waveform is synchronized while exhibiting one vibration characteristic. Meanwhile, in the remaining four output waveforms, namely when the input oscillation frequency is 1.44 MHz and 1.37 MHz (two waveforms at the top of the graph) and when the input oscillation frequency is 1.09 MHz and 1.02 MHz (two waveforms at the bottom of the graph), the output waveform exhibits complex vibration characteristics where a short oscillation is repeated with a long cycle. This shows that the remaining input oscillation frequencies are not synchronized.

Figure 8B:
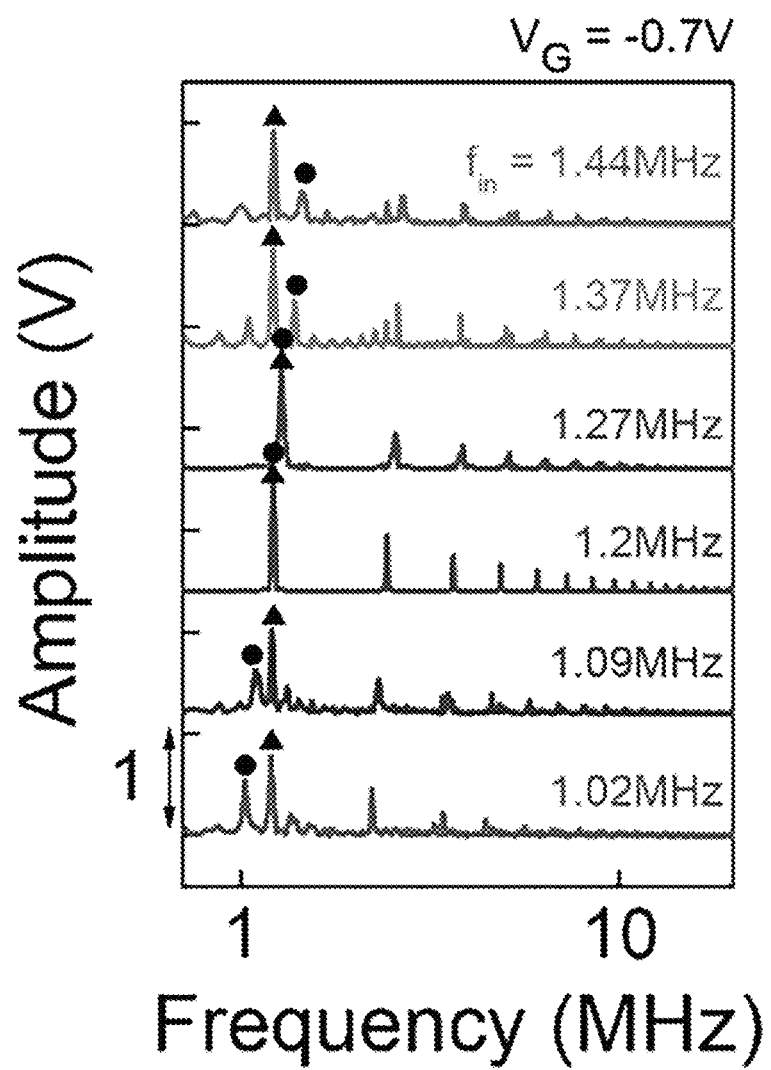
FIG. 8B is a graph showing the magnitude of the oscillation frequency component of the output waveform by performing FFT (Fast Fourier Transform) to the amplitude of the output waveform of FIG. 8A.

FIG. 8B is a graph showing the magnitude of the oscillation frequency component of the output waveform by performing FFT (Fast Fourier Transform) to the amplitude of the output waveform of FIG. 8A.

Similar to the result of FIG. 8A, if the input oscillation frequency is 1.27 MHz and 1.2 MHz, one primary peak representing the intrinsic oscillation frequency is shown, whereas for the remaining input oscillation frequencies, a more complex vibration characteristic is shown.

Figure 8C:
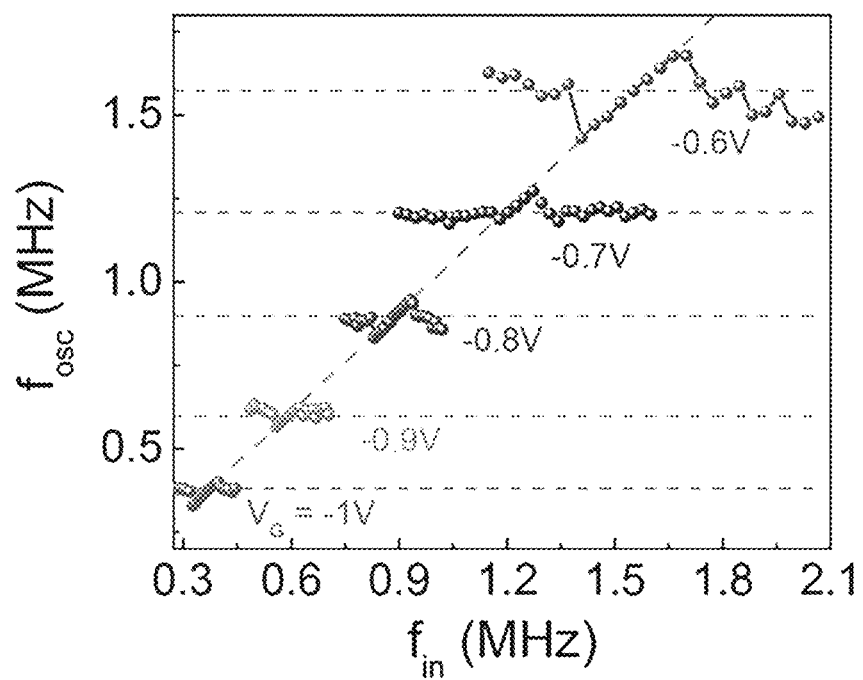
FIG. 8C is a graph showing the change of the oscillation frequency of the output waveform according to the input oscillation frequency in the nano-oscillator device of FIG. 8A for each magnitude of the applied gate voltage.

FIG. 8C is a graph showing the change of the oscillation frequency of the output waveform according to the input oscillation frequency in the nano-oscillator device of FIG. 8A for each magnitude of the applied gate voltage. From the result of the graph, it may be found that the synchronization characteristic in which the oscillation frequency and phase of the nano-oscillator are locked to an external bias is implemented.

A computing system in which a plurality of oscillator devices are coupled may be implemented by using the synchronization characteristics between the oscillators.

Figure 9:
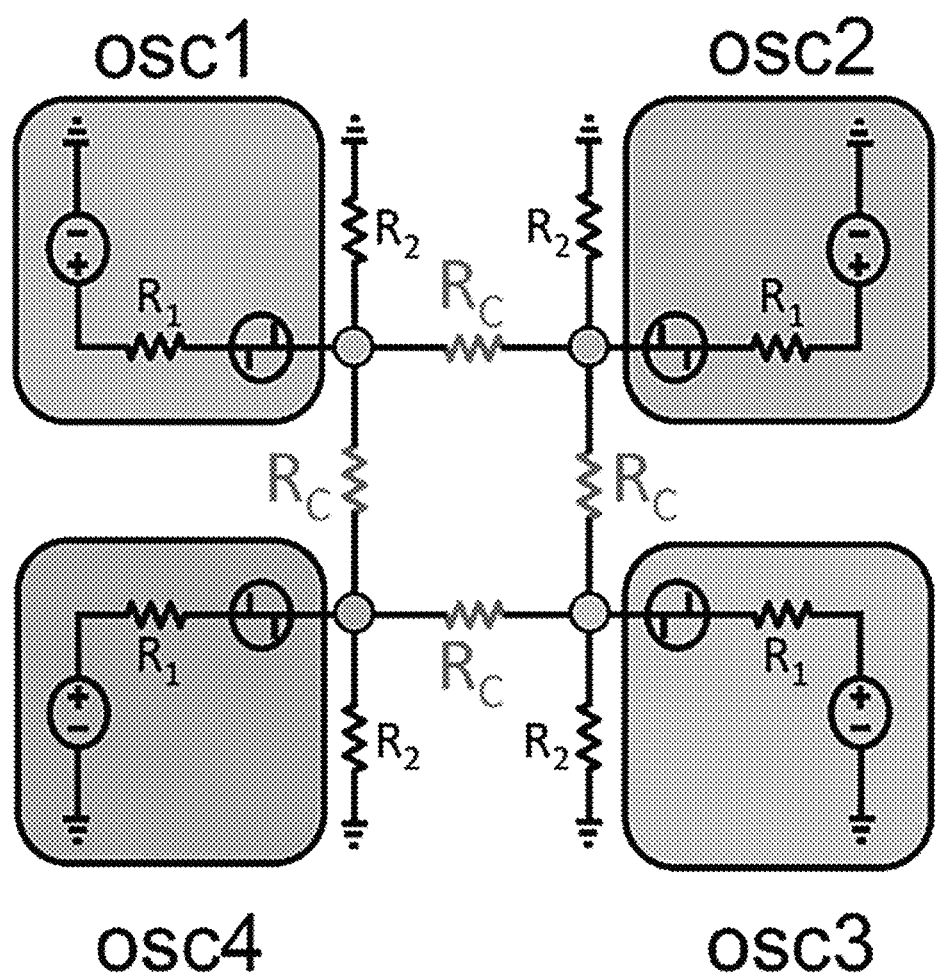
FIG. 9 shows the structure of a computing unit implemented using a network in which nano-oscillator devices are coupled according to an embodiment.

FIG. 9 shows the structure of a computing unit implemented using a network in which nano-oscillator devices are coupled according to an embodiment. As described above with reference to FIG. 6, the OTS-based oscillator device according to the embodiment may be modeled as a parallel connection structure of a voltage-controlled switch and a capacitor. The computing unit shown in FIG. 9 is composed of a network in which four identical oscillator devices (osc1, osc2, osc3, osc4) and coupling resistors ($R_c$) are coupled. In the network of the structure, the coupling force between the oscillator devices becomes stronger or weaker depending on the magnitude of the resistance value of the coupling resistor ($R_c$). As a result of simulation using SPICE software, if the coupling force is weakened (e.g., $R_c$ is set to 5 kΩ or more), adjacent devices oscillate with different phases (e.g., antiphase oscillation with a phase difference of π), and if the coupling force becomes stronger (e.g., $R_c$ is set to 50Ω or less), adjacent devices oscillate in the same phase (in-phase oscillation). From these results, it may be found that the computing system prepared by coupling the nano-oscillator devices according to the embodiment may be implemented.

Figure 10:
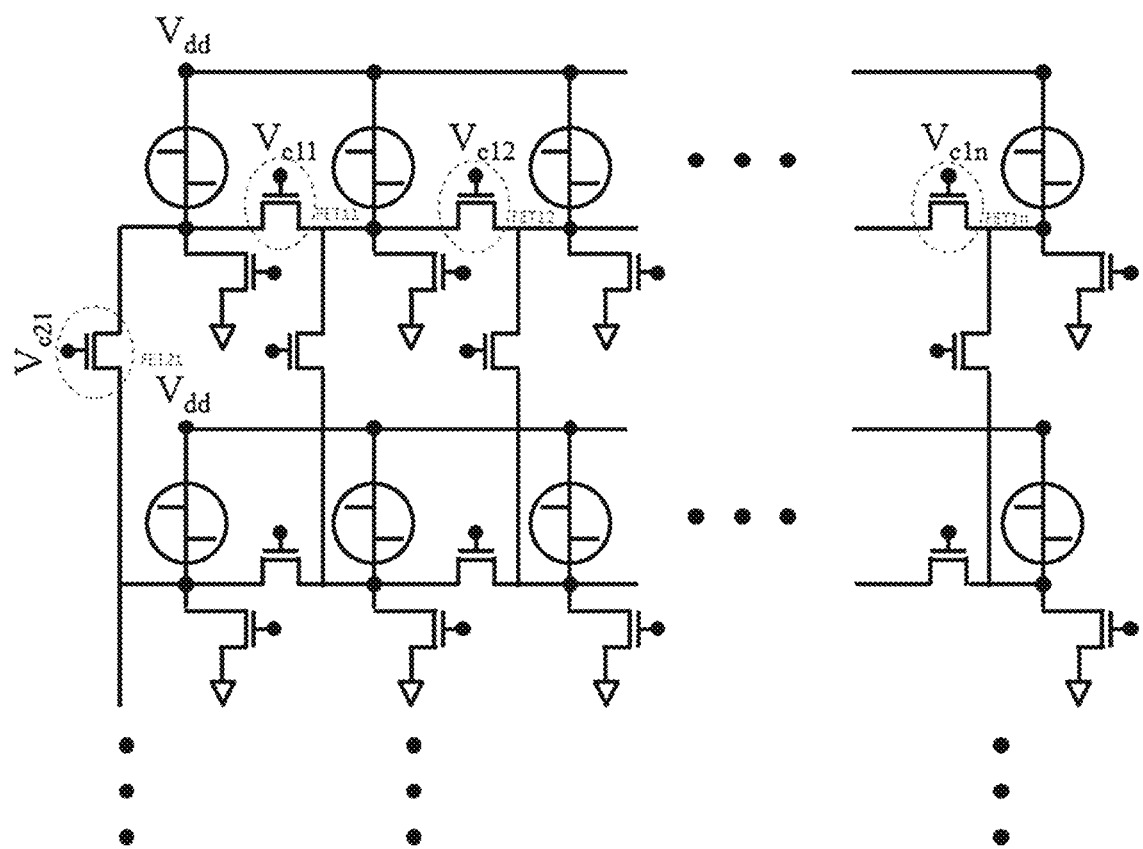
FIG. 10 shows an n×n computing system implemented by connecting nano-oscillator devices according to an embodiment by a field effect transistor.

FIG. 10 shows an n×n computing system implemented by connecting nano-oscillator devices according to an embodiment by a field effect transistor. Referring to FIG. 10, the oscillator devices are arranged in x and y directions and are connected to each other by a field effect transistor (FET). As will be described later, the phase difference of the oscillator may be adjusted according to the gate voltage applied to the FET. For example, by changing the value of the gate voltage ($V_{c11}$) of the transistor (FET11) connecting the first oscillator device (osc11) and the second oscillator device (osc12), the phase difference of the oscillator devices (osc11, osc12) may be adjusted.

Figure 11A:
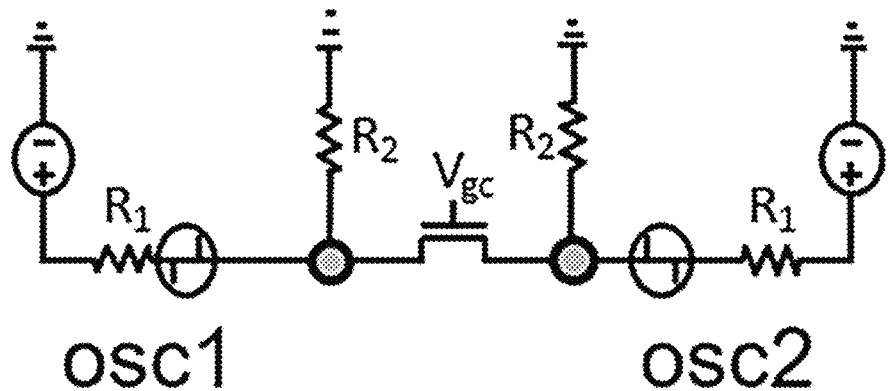
FIG. 11A shows a computing unit composed of two nano-oscillator devices connected by a field effect transistor.
Figure 11B:
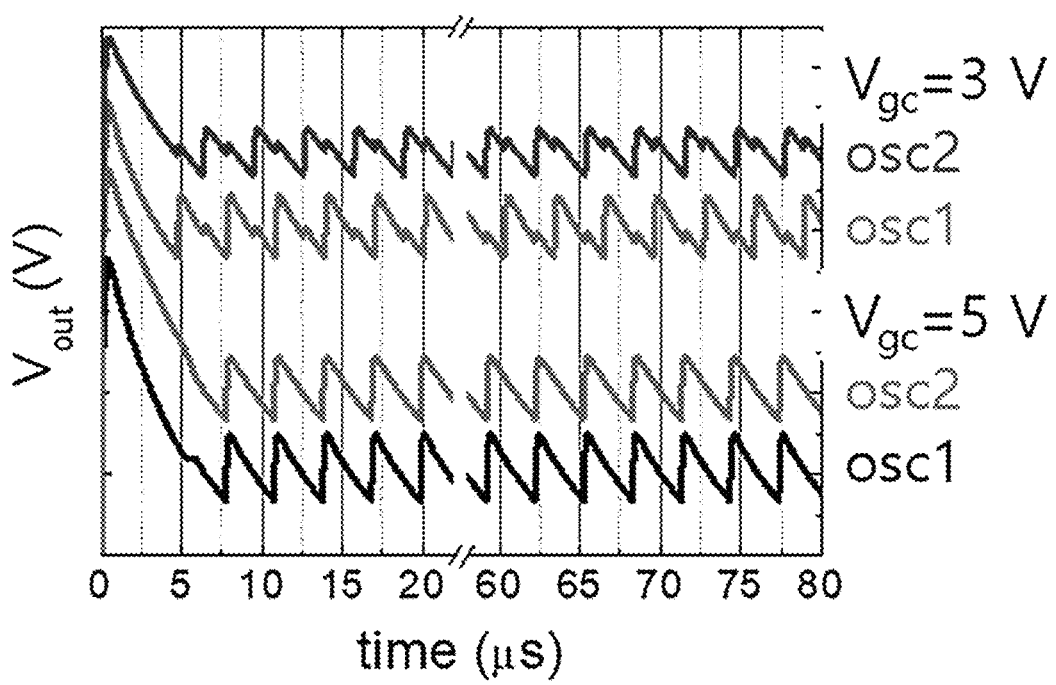
FIG. 11B is a graph showing a phase difference of the oscillator devices according to the gate voltage applied to the field effect transistor that connects the nano-oscillator devices in FIG. 11A.

According to an embodiment, by changing the gate voltage applied to the gate terminal of each field effect transistor, it is possible to control the phase difference between the oscillator devices. FIG. 11A shows a computing unit composed of two nano-oscillator devices (osc1, osc2) connected by a field effect transistor, and FIG. 11B is a graph showing a phase difference of the oscillator devices according to the gate voltage ($V_{gc}$) applied to the field effect transistor that connects the nano-oscillator devices in FIG. 11A. As shown in FIG. 11B, it may be found that, if the gate voltage ($V_{gc}$) is 3 V, the phases of the oscillator device (osc1) and the oscillator device (osc2) are opposite, and if the gate voltage ($V_{gc}$) is 5 V, the phases of the oscillator device (osc1) and the oscillator device (osc2) are the same.

Figure 12A:
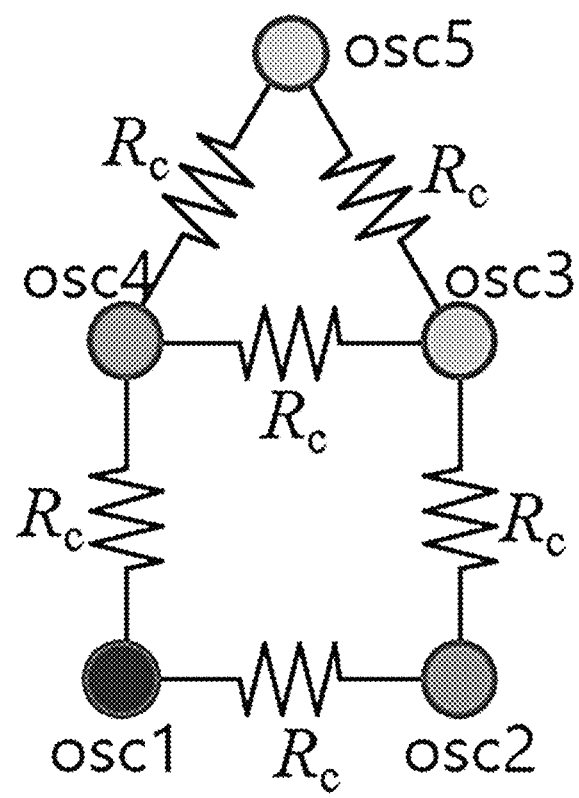
FIG. 12A shows a computing system composed of five oscillator devices connected by resistors.
Figure 12B:
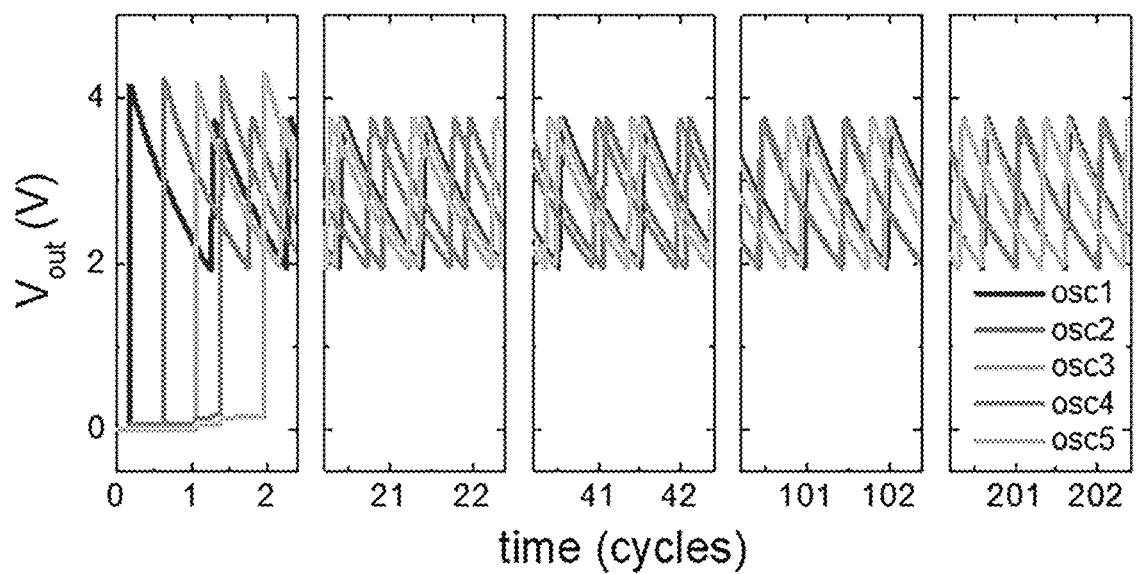
FIG. 12B is a graph showing vibration curves of the five oscillator devices shown in FIG. 12A.

FIG. 12A shows a computing system composed of five oscillator devices connected by resistors. If an Ising machine made of such oscillator devices is used, the Max-Cut problem at a plurality of nodes may be solved as shown in FIG. 12D. In order to solve the problem, it is important to determine the coupling coefficient ($R_c$ in FIG. 12A) for the oscillators to oscillate in opposite phases. As can be seen from FIG. 11B, by changing the gate voltage (change in coupling resistance), the phase difference between the two connected oscillators may be adjusted.

As a result of measuring the phase difference between the oscillators while changing the resistance value of $R_c$ in the configuration of FIG. 12A, it may be found that the phase difference between the oscillators shows 180° oscillation most stably when $R_c$=100 kΩ. FIG. 12B shows the waveform of each oscillator device when $R_c$=100 kΩ. Referring to the graph of FIG. 12B, it may be found that the oscillators are classified into three groups after about 200 cycles (group 1: osc1 and osc3, group 2: osc2 and osc4, group 3: osc5).

Figure 12C:
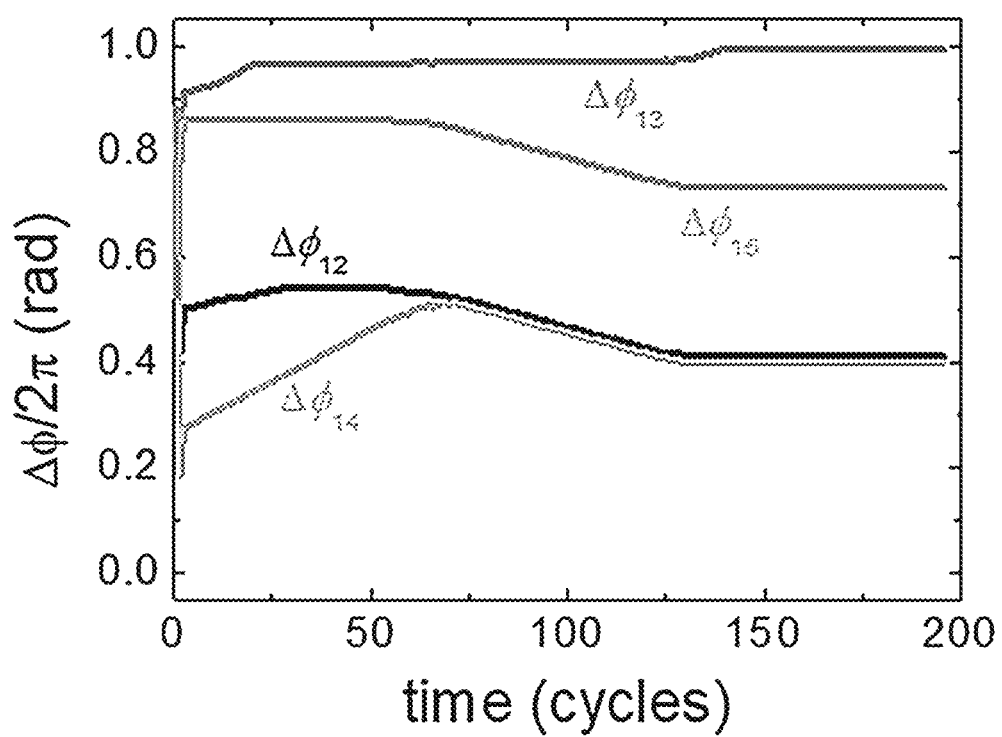
FIG. 12C is a graph showing the change of a phase difference between a first oscillator device (osc1) and the other oscillator devices (osc2 to osc5) according to time.
Figure 12D:
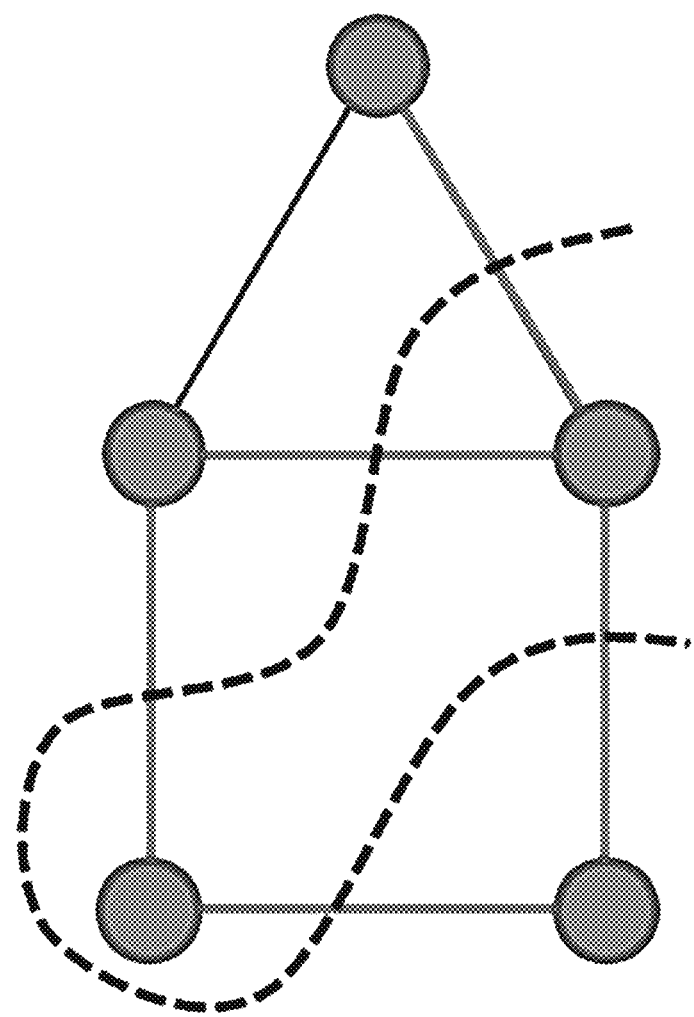
FIG. 12D is a diagram to explain the process of solving a Max-Cut problem of five nodes by using the computing system composed of five oscillator devices of FIG. 12A.

The graph of FIG. 12C shows the change of the phase difference between the first oscillator device (osc1) and the other oscillator devices (osc2 to osc5) according to time. Here, the time corresponding to one cycle of the oscillator is set as 2*π, and the time interval between the peaks of the oscillators is calculated as the phase difference. As shown in FIG. 12C, it may be found that the first oscillator device (osc1) oscillates in a phase ($\Delta\varphi_{12}=0.5$) opposite to the second oscillator device (osc2), and the third oscillator device (osc3) oscillates in the same phase ($\Delta\varphi_{13}=1.0$) as the first oscillator device (osc1).

As shown in FIG. 12B, it may be found that the third oscillator device (osc3) oscillates in the same phase as the first oscillator device (osc1), and the second oscillator device (osc2) and the fourth oscillator device (osc4) oscillates with a phase (with a phase difference as much as π) opposite to the first oscillator device (osc1). Accordingly, this means that the first and third oscillator devices (osc1, osc3) are disconnected from the second oscillator device (osc2) and the fourth oscillator device (osc4). In addition, it may be found that the fifth oscillator device (osc5) oscillates with an intermediate phase of the first and third oscillator devices (osc1, osc3) and the second and fourth oscillator devices (osc2, osc4), which means that the fifth oscillator device (osc5) is attached to one of both groups and disconnected from the other of both groups. In FIG. 12D, a red line refers to a line that becomes a cut of the max-cut problem. From the relationship between the phase difference of the oscillators and the cut-line described above, it may be found that the max-cut problem can be solved through the Ising machine.

According to another embodiment of the present disclosure, in the computing unit configured with the nano-oscillator devices, the nano-oscillator devices may be connected to each other with a capacitor or a resistor. In the former embodiment, the phase difference between the oscillators may be controlled by adjusting the gate voltage applied to the field effect transistor. However, in this embodiment, the coupling coefficient is arbitrarily set using a variable capacitor or a variable resistor, and through this, the phase difference between the oscillators may be controlled. The description of the phase difference according to the change of the coupling coefficient is the same as that described in the former embodiment using the field effect transistor.

According to the nano-oscillator device described above, vibration characteristics may be implemented using a switching element and a load element connected thereto in series. The conventional oscillator device is difficult to be manufactured in a small size since it includes a capacitor, but the oscillator device of the new structure may be manufactured without a capacitor, so it can be miniaturized and advantageously used in a large computing system using a large number of oscillator devices.

In addition, if a field effect transistor is used as a load element, the oscillation frequency of the output waveform of the oscillator may be adjusted according to the applied gate voltage. The oscillator device capable of controlling vibration characteristics in real time as described above may be used in various fields.

Since the oscillator devices have a synchronization characteristic in which the phase and oscillation frequency are locked against an external force, a non-traditional computing system may be implemented by coupling the oscillator devices. The coupling force between the devices may be adjusted according to the magnitude of the resistance that connects the oscillators to each other, and accordingly, it is possible to control the phase difference between adjacent oscillators.

Although the present disclosure has been described above with reference to the embodiments, it should be understood that the present disclosure can be variously modified and changed by those skilled in the art without departing from the idea and scope of the present disclosure defined in the appended claims.

[Description of government-funded research and development]

This research is conducted by Korea Institute of Science and Technology under the support of "Sub-pJ spiking artificial neural network technology" (Project Series No: 1711128542) of the Ministry of Science and ICT.

What is claimed is:

1. An oscillator-based computing unit, which is implemented using a network in which a plurality of nano-oscillator devices are coupled, wherein each of the nano-oscillator devices, consisting of:
   a switching element configured to be switched to an ON state at a threshold voltage or above and switched to an OFF state below a holding voltage; and
   a load element connected to the switching element in series,
   wherein an output waveform at a node between the switching element and the load element has a vibration characteristic that is repeated at a predetermined period,
   wherein a power supply provides a DC voltage to a first terminal of the nano-oscillator device, a second terminal of the nano-oscillator device is grounded, and the first terminal and the second terminal are different from the node,
   wherein a phase difference between adjacent oscillator devices depends on a coupling force therebetween.

2. The oscillator-based computing unit according to claim 1,
   wherein the load element is a transistor element, and
   wherein an oscillation frequency of the output waveform is adjusted in real time according to a gate voltage applied to the transistor element.

3. The oscillator-based computing unit according to claim 1,
   wherein the load element is a resistor element.

4. The oscillator-based computing unit according to claim 3,
   wherein an oscillation frequency of the output waveform is determined according to a resistance value of the resistor element.

5. The oscillator-based computing unit according to claim 1,
   wherein each of the nano-oscillator devices is connected to a nano-oscillator device adjacent thereto by a field effect transistor.

6. The oscillator-based computing unit according to claim 5,
   wherein the connection element is the field effect transistor,
   wherein the phase difference between the adjacent oscillator devices is controlled according to a change of a gate voltage applied to a gate terminal of the field effect transistor.

7. The oscillator-based computing unit according to claim 1, wherein each of the nano-oscillator devices is connected to a nano-oscillator device adjacent thereto by a resistor.

8. The oscillator-based computing unit according to claim 7, wherein the phase difference between the adjacent oscillator devices is controlled by setting a resistance value of the resistor.

* * * * *